United States Patent [19]
Khang

[11] Patent Number: 6,011,743
[45] Date of Patent: Jan. 4, 2000

[54] CHARGE PUMP CIRCUIT FOR MEMORY DEVICE

[75] Inventor: Chang-Man Khang, Kyonggi-do, Rep. of Korea

[73] Assignee: LG Semicon Co., Ltd., Cheongju, Rep. of Korea

[21] Appl. No.: 09/131,384

[22] Filed: Aug. 7, 1998

[30] Foreign Application Priority Data

Dec. 17, 1997 [KR] Rep. of Korea ................ 97-69599

[51] Int. Cl.$^7$ .................................................. G11C 7/00
[52] U.S. Cl. ............... 365/226; 365/189.09; 365/189.06; 365/189.11; 327/536
[58] Field of Search ................... 365/203, 226, 365/189.09, 185.25, 189.11; 327/148, 157, 536

[56] References Cited

U.S. PATENT DOCUMENTS

| | | | |
|---|---|---|---|
| 5,038,325 | 8/1991 | Douglas et al. | 365/189.06 |
| 5,483,486 | 1/1996 | Javanifard et al. | 365/185.17 |
| 5,774,399 | 6/1998 | Kwon | 365/185.18 |
| 5,841,725 | 11/1998 | Kang et al. | 365/226 |

*Primary Examiner*—David Nelms
*Assistant Examiner*—Tuan T. Nguyen

[57] ABSTRACT

The present invention relates to a charge pump circuit for memory device, more particularly to a circuit charging cell capacitors or bitlines up to a full level of power supply voltage by means of compensating for the loss caused by the threshold voltages of memory transistors with the elevated potential higher than the power supply voltage.

The present invention includes an elevated potential terminal connected to an output capacitor, a level monitor connected to said elevated potential terminal wherein a certain range of voltage is divided into a plurality of voltage level intervals, and the level monitor generates a plurality of pumping enable signals corresponding to a plurality of the voltage level intervals, and a plurality of the pumping enable signals have different activated time one another, and the level monitor activates the pumping enable signals corresponding to the voltage level intervals to which the elevated potential belongs among the voltage level intervals by means of detecting the elevated potential, a pulse generator connected to the level monitor wherein the pulse generator generates a pulse signal, and wherein at least one of the pumping enable signals is activated, and a plurality of charge pump modules connected to the pulse generator wherein the charge pump modules are enabled by the pumping enable signals, and wherein the charge pump modules supplies the output capacitor with electric charge with pumping operation by the pulse signals.

16 Claims, 4 Drawing Sheets

CHARGE PUMP CIRCUIT FOR MEMORY DEVICE

BACKGROUND OF THE INVENTION

1. Field of Invention

The present invention relates to a charge pump circuit for a memory device, more particularly to a circuit charging cell capacitors or bitlines up to a full level of power supply voltage, by means of compensating for the loss caused by the threshold voltages of memory transistors with elevated potential higher than the power supply voltage.

2. Description of Background Art

A charge pump circuit is one of a power supply circuit providing an elevated potential VPP higher than the power supply voltage VDD. It is not expected in general that a circuit may produce an output voltage higher than the power supply voltage VDD. However, a semiconductor integrated circuit quite often requires an output voltage higher than the power supply voltage VDD. Especially in memory devices such as a DRAM, more often used is the elevated potential that is higher than the power supply voltage VDD, for the purpose of making up for the loss caused by the threshold voltage of cell transistors.

The usage of the elevated potential is as follows, more specifically.

A wordline driver circuit of a DRAM increases the wordline voltage up to a high voltage of the elevated potential VPP, and then a data voltage VDD of high level on the bitline is written in the cell if the loss is caused by the threshold voltage VT of the NMOS cell transistors. Moreover, the sufficient data voltage is carried to the bitline in reading.

A bitline isolation is achieved in the bitline isolation circuit of a DRAM wherein a full VDD voltage can be transmitted to the memory cell without the loss due to threshold voltage by means of having the gate voltage of the transistors reach a sufficient high voltage. A flip-flop sense amplifier amplifies the data written from a data bus line into VDD and 0 Volt, transmitting the voltages to the cell without the loss of the threshold voltage VT.

In a data output buffer circuit, the driving capability of the load of the output transistor decreases as the power supply voltage is lowered from 5 to 3.3 Volts. A NMOS circuit is used instead of a CMOS circuit since latch-up is likely to happen in the output transistor due to a large current, thereby causing a low charging speed of the load due to the loss of the threshold voltage VT and an insufficient high level of the output voltage VOH. Accordingly, the load is driven to the sufficient high level of the output voltage VOH with high speed by means of elevating the gate voltage of the NMOS circuit up to VPP.

In the above-explained circuit, the magnitude of a high voltage pulse, i.e. the elevated potential VPP, should be bigger than the added value of (VDD+VT), and especially in the wordline driver, a voltage higher than the elevated potential VPP is required since the threshold voltage of the memory cell transistor is higher than other kinds of transistors. The memory cell transistor has the smallest size among other transistors formed on a chip. The threshold voltage VT of a general NMOS transistor is 0.7 to 0.8 Volt, whereas that of the memory cell transistor amounts to about 1.5 Volt. Thus, the wordline driver should be elevated over the maximum value of the threshold voltage VT. The elevated potential VPP, having the threshold voltage VT of the memory cell transistor as a reference, is available for both bitline isolation and data output buffer.

FIG. 1 shows a conventional charge pump circuit for generating an elevated potential VPP.

Referring to FIG. 1, the charge pump circuit generating the elevated potential has a level monitor 6 controlling an oscillator 1 by means of detecting a level of the output elevated potential VPP.

Once an oscillating enable signal OSCEN is generated from a level monitor 6, the oscillator 1 starts to operate, producing a pulse signal OSC. The voltage of node N becomes 2 VDD in the interval of high level of the pulse signal OSC wherein the node has been supplied with the voltage of VDD by the clamp 3 as soon as the NMOS capacitor 2 has been charged. The NMOS transistor 4 is turned on by the node N voltage of 2 VDD and then, the electric charge having been stored in the node N through the turned-on NMOS transistor 4 is supplied to the output terminal and accumulated in the output capacitor 5. The elevated potential VPP has a value higher than or equal to power supply voltage VDD after the electric charges have been supplied to the output capacitor 5 sufficiently with the repeated accumulating operations as is explained above.

However, the quantity of the electric charges supplied by the pulse signal OSC of a single period are fixed to a constant amount when the elevated voltage VPP is generated through the conventional charge pump circuit.

Accordingly, more that one pulse signals are required for supplying sufficient electric charges.

Moreover, the elevated potential becomes higher than is necessary owing to the fixed quantity of the charges in case that the required quantity is less than the quantity supplied on a single period of the pulse signal OSC.

SUMMARY OF THE INVENTION

Accordingly, the present invention is directed to a charge pump circuit that substantially obviates one or more of the problems due to limitations and disadvantages of the related art.

The object of the present invention is to provide a charge pump circuit for generating an elevated potential precisely and quickly by means of supplying a quantity of electric charge proportional to the difference between the present output elevated potential and the level of the desired elevated potential with a selective operation of a plurality of charge pump modules.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a charge pump circuit includes an elevated potential terminal connected to an output capacitor, a level monitor connected to said elevated potential terminal wherein a certain range of voltage is divided into a plurality of voltage level intervals, and the level monitor generates a plurality of pumping enable signals corresponding to a plurality of the voltage level intervals, and the plurality of the pumping enable signals have different activated time with respect to one another, and the level monitor activates the pumping enable signals corresponding to the voltage level intervals to which the elevated potential belongs among the voltage level intervals by means of detecting the elevated potential, a pulse generator connected to the level monitor wherein the pulse generator generates a pulse signal, and wherein at least one of the pumping enable signals is activated, and a plurality of charge pump modules connected to the pulse generator wherein the charge pump modules are enabled by the pumping enable signals, and wherein the charge pump modules supply the output capacitor with electric charge with pumping operation by the pulse signals.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF PREFERRED EMBODIMENT

Reference will now be made in detail to the preferred embodiments of the present invention, examples of which are illustrated in the accompanying drawings.

Figure 1:
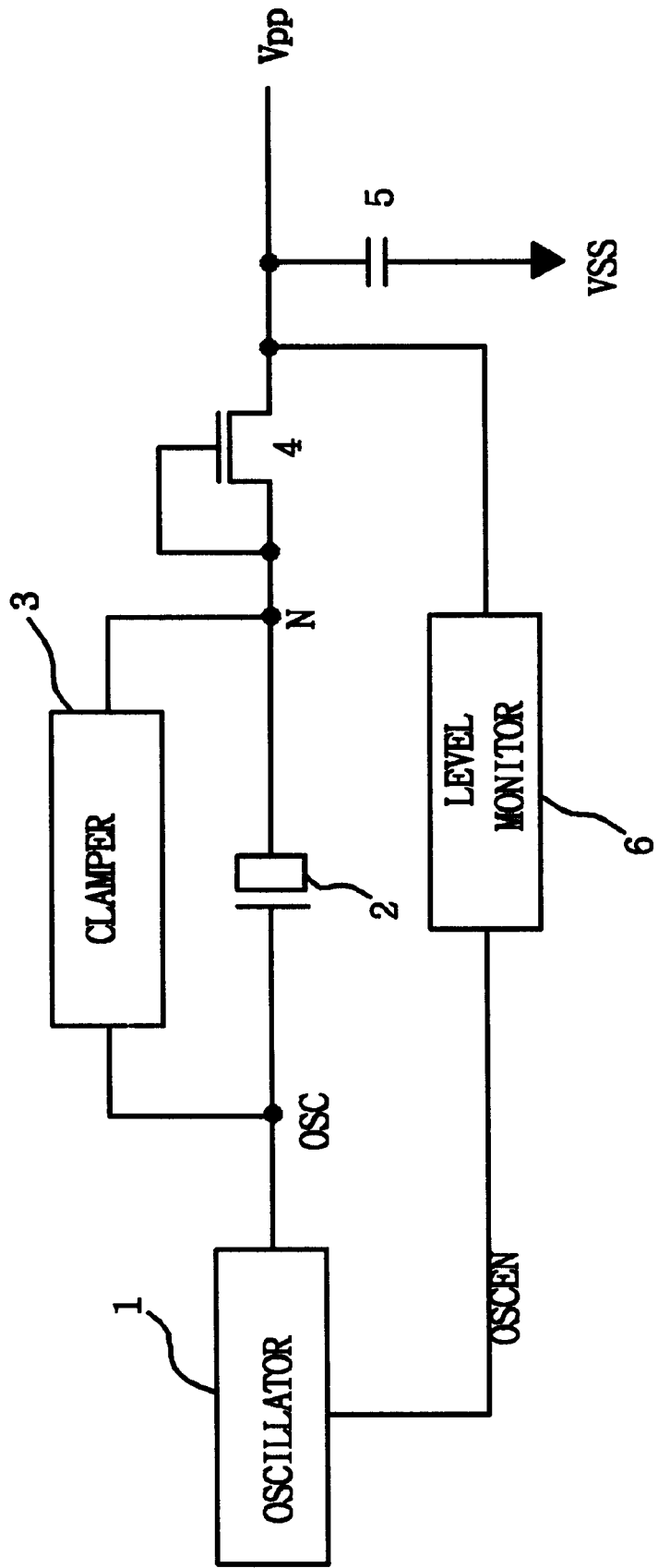
FIG. 1 shows a conventional charge pump circuit.
Figure 2:
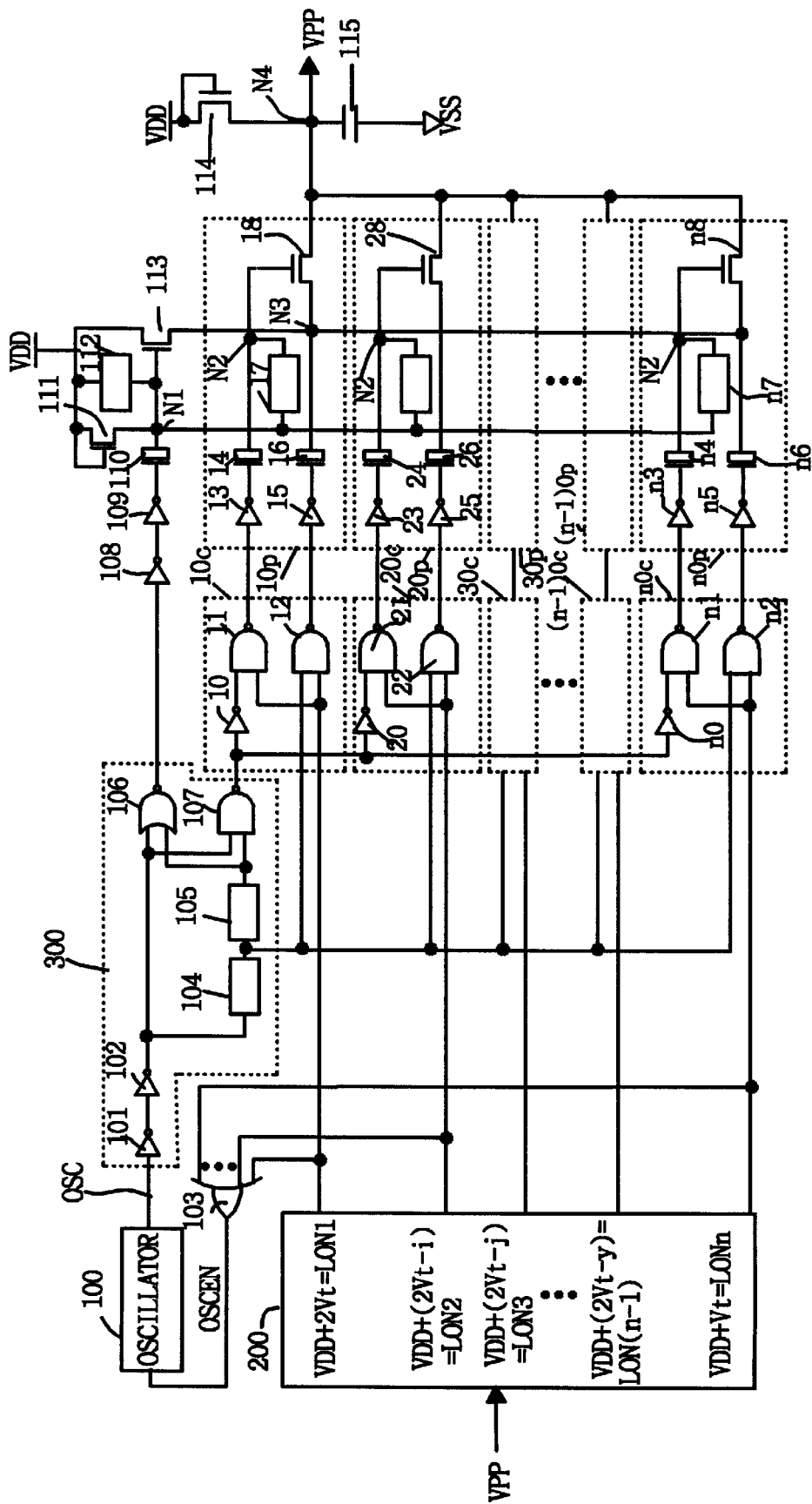
FIG. 2 shows a circuit layout including a plurality of charge pump circuits.

FIG. 2 shows a circuit layout including a plurality of charge pump modules which are operated selectively.

Referring to FIG. 2, the present invention may be divided into the parts of an oscillator 100, a level monitor 200, a level shifter 300, a plurality of pulse generators n0c, and a plurality of charge pump modules n0p, where n's are natural numbers.

The level monitor 200 detects the level of an elevated potential VPP which is being output, and then generates control signals LON1 to LONn if the detected elevated potential VPP is lower than the value of (VDD+2VT).

The generated control signals LON1 to LONn are outputted according to each divided value which are attained by means of dividing the interval between the minimum value of (VDD+VT) and the maximum value of (VDD+2VT) equally by n. The control signal LON1 is outputted if the elevated potential which is being outputted is between the maximum value of [VDD+(2VT−i)] and the value of (VDD+2VT) of the desired elevated potentials. Another control signal LON2 is outputted once the elevated potential is equal to or less than [VDD+(2VT−i)] and higher than [VDD+(2VT−j)]. Another control signal LONn is outputted if the elevated potential is equal to or less than (VDD+VT).

The control signals LON1 to LONn are used in two ways.

Firstly, the control signals are used as a driving signal for the oscillator 100. All of the signals LON1 to LONn from the level monitor 200 are inputted into an OR gate 103, outputted as oscillating enable signals OSCEN. The oscillator generates a pulse signal OSC as soon as at least one of them LON1 to LONn is activated into high level.

Secondly, the control signals LON1 to LONn are used for generating pulse signals to be supplied into the charge pump modules 10p to n0p, respectively. A pair of signals having a certain phase difference by level shifter 300 are generated as soon as the pulse signal OSC is outputted from the oscillator 100. Then, one of the two signals is applied to the pulse generator 10c to n0c along with the control signals LON1 to LONn. And then each of the pulse generator 10c to n0c generates a different pulse signal having a phase opposite to the inputted pulse signal from the level shifter 300.

The level shifter 300 and the pulse generators 10c to n0c are composed of the following.

The level shifter 300 including two inverters 101 and 102 is supplied with the pulse signal OSC outputted from the oscillator 100 wherein the driving ability of the pulse signal OSC is improved through the inverters 101 and 102. The pulse signal OSC of which driving ability has been improved becomes the input signal of the two input NOR gate 106 and two input NAND gate 107 respectively.

However, as each input terminal of the logic gates 106 and 107 is connected to the two delays 104 and 105 connected in series, each of the pulse signals from the NOR gate 106 and the NAND gate 107 has a different phase in view of the delayed time in the delays 104 and 105 due to the characteristic of the logic operations, i.e. NOR and NAND operations, processed in each logic gate 106 and 107.

The object of the level shifter 300, which is to produce a pair of pulse signals having inverted phases with respect to each other, is achieved by means of designing the delay time of the delays 104 and 105 to correspond to the width of the pulse signal OSC generated from the oscillator 100.

The pulse generator 10c consists of an inverter 10, a pair of NAND gates 11 and 12.

The first NAND gate 11 is supplied with both the control signal LON1 and the pulse signal from the NAND gate 107 of the level shifter 300 wherein the pulse signal is inverted by the inverter 10. The second NAND gate 12 is supplied with both the control signal LON1 and the pulse signal OSC outputted from the oscillator 100 wherein the inputted pulse signal OSC is the signal which has passed through the first delay 104 of the two delay 104 and 105 connected in series.

Although the pulse signals from the NAND gates 11 and 12 of the pulse generator 10c are slightly different from each other with respect to phase, the phase of the pulse signal from the first NAND gate 11 is a little slower than that from the second NAND gate 12. The composition and operation of the first pulse generator 10c is able to be applied similarly to those of other pulse generators 20c to n0c.

The pulse signal from the NOR gate 106 of the level shifter 300, of which driving ability has been improved by a pair of the inverters 108 and 109, charges or discharges an NMOS capacitor 110.

A node N1 connected electrically to the shorted drain/source of the NMOS capacitor 110 is supplied with the voltage of (VDD−VT) through the NMOS transistor 111 having a diode connection wherein the voltage of the node N1 regulates that of the gate of the NMOS transistor 113.

It is desirable for the NMOS transistor 113, being turned on, to supply a full level of the power supply voltage through its source without the loss of the threshold voltage VT. Hence, the voltage equal to or higher than (VDD+VT) is necessarily applied to the gate of the NMOS transistor 113, for which the NMOS capacitor 110 supplies the gate of the NMOS transistor 113 with the voltage equal to or higher than (VDD+VT).

A clipper 112 lies between the node N1 and the power source voltage VDD in order to prevent a voltage of the node N1 that is higher than necessary from turning on the NMOS transistor 113. It is sufficient for the limit voltage of the clipper 112 to be (VDD+3VT) since the voltage for turning on the NMOS transistor 113 is (VDD+VT).

A charge pump module 10p being operated by the pair of pulse signals from the pulse generator 10c pumps electric charges by means of charging or discharging of the pair of NMOS capacitors 14 and 16 according to each pulse signal. Once an NMOS transistor 18 becomes turned on by the voltage of the node N2 connected to the shorted source/drain of the NMOS capacitor 14, an output capacitor 115 is charged as soon as the electric charges having been stored in the other NMOS capacitor 16 are supplied through the NMOS transistor 18. As a clamp 17 lies between the nodes N1 and N2, the voltage of the node N2 becomes 2VDD according to the sufficiently high voltage, about (2VDD−VT), of node N1. The composition and operation of the first charge pump module 10p is able to be applied similarly to those of other charge pump modules 20p to n0p.

The output node N4 maintains the voltage of (VDD−VT) through the NMOS transistor 114 all the time except during the pumping operation of the charge pump modules 10p to n0p.

Figure 3:
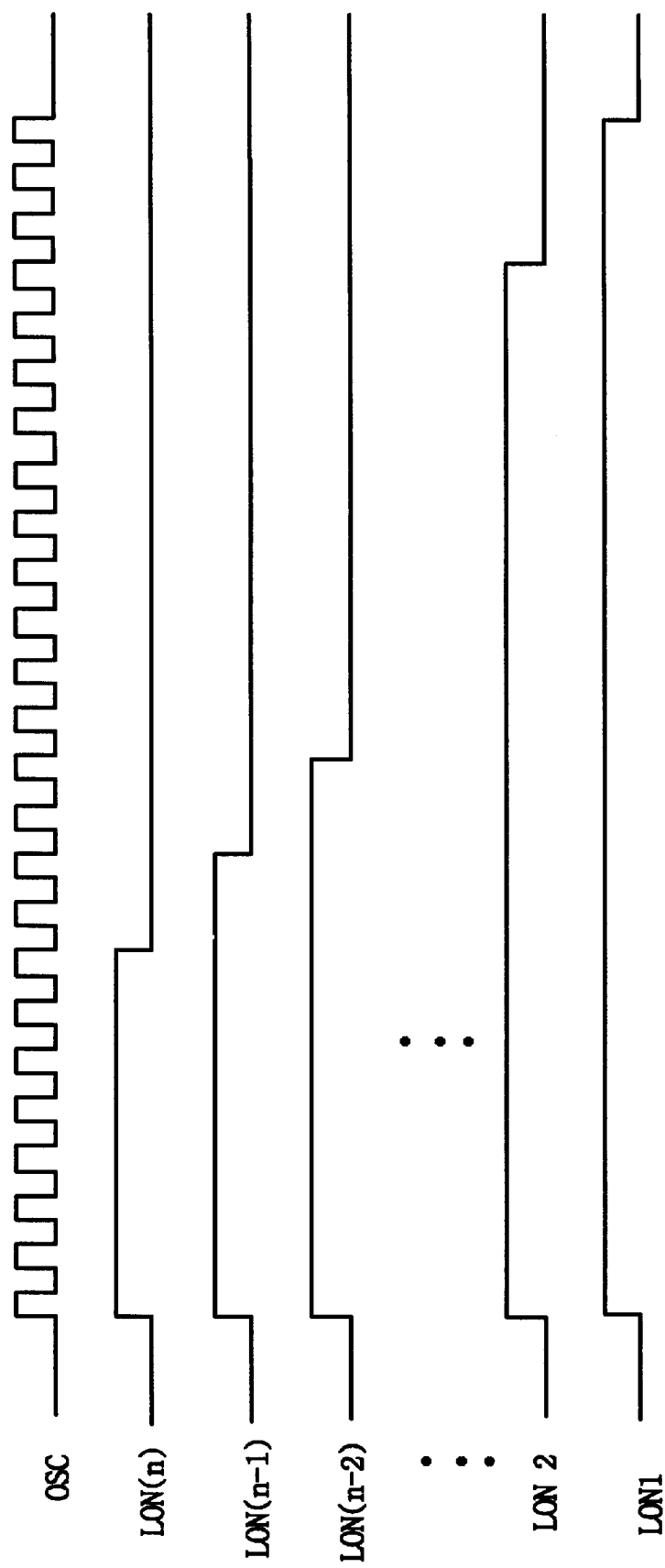
FIG. 3 shows the various waveforms of the input/output signals in the charge pump circuit according to the present invention.

FIG. 3 shows the various waveforms of the input/output signals in the charge pump circuit according to the present invention.

The elevated potential VPP is unable to reach the maximum value of (VDD+2VT) at the initial state of the circuit operation while the circuit is supplied with the power supply voltage VDD, wherein there is no control signal LON1 to LONn which is activated to high level since the level monitor 200 has not been enabled yet.

Looking into the voltages of the nodes N1 to N3, the node N1 is supplied by the NMOS transistor 111 with the voltage of (2VDD−VT) which is resulted from adding VDD of the charged NMOS capacitor 110 to (VDD−VT).

The node N2 is supplied with VDD by the operation of the clamp 17. The clamp 17 supplies the node N2 with a full voltage of VDD having no loss of the threshold voltage VT if the voltage VN1 of the node N1 is equal to or higher than (VDD+VT), wherein the clamp 17 is cross-coupled with the NMOS transistor 18 of which gate is controlled by the voltage VN1 of the node N1.

The node N3 is also supplied with a full level of the voltage of VDD without a loss of the threshold voltage VT by the NMOS transistor 113 of which gate is controlled by the voltage of (2VDD−VT) on the node N1. When the node N3 has VDD, the maximum value, i.e. (VDD+2VT), of the elevated potential VPP is achieved by pumping operation after the control signals LON1 to LONn have been activated by means of having the level monitor 200 enabled.

All of the control signals LON1 to LONn are activated to high level since the elevated potential VPP is less than the minimum value of (VDD+VT) of the reference level which has been set up in the level monitor 200.

Representing the charge pump modules 10p to n0p operated by the control signals LON1 to LONn respectively, the pumping operation of the charge pump module 10p operated by the activated control signals LON1 is as follows.

Once the control signal LON1 has been activated to high level in the level monitor 200, an oscillating enable signal OSCEN from the OR gate 103 is also activated to high level. Thus, the oscillator 100 starts to operate. Once the oscillator 100 is activated, a pulse signal OSC having a certain pulse width is output.

The pulse signal OSC is transformed into another pulse signal to drive the charge pump module 10p by the level shifter 300 and the pulse generator 10c. A low level is supplied to the gate of the NMOS capacitor 110 during the first interval of high level of the pulse signal from the oscillator 100, because the phase of the pulse signal supplied to the gate of the NMOS capacitor 110 is opposite to that of the charge pump module 10p.

Accordingly, the NMOS capacitor 110 is discharged and then the voltage of the node N1 is restored from 0 to (VDD−VT) by the NMOS transistor 111. As the pulse signal supplied to the charge pump module 10p is a high level, a pair of the NMOS capacitors 14 and 16 are charged to have the voltages of 2VDD at the nodes N2 and N3. Thus, electric charge stored in the NMOS capacitor 16 is supplied to an output capacitor 115 connected to the elevated-potential output node N4.

The charge pump module 10p stops operating during the first low state of the pulse signal OSC from the oscillator 100, and instead, the voltage of the node N1 becomes (VDD+3VT) which is the limit voltage of the clipper 112. Thus, the voltages of the nodes N2 and N3 go down to VDD level, completing the pumping operation during the one period of the pulse signal OSC.

Once such a series of the pumping operation is repeated in another charge pump module, the desired elevated voltage of (VDD+2VT) is gained in accordance with the increasing charge accumulated in the output capacitor 115.

Figure 4:
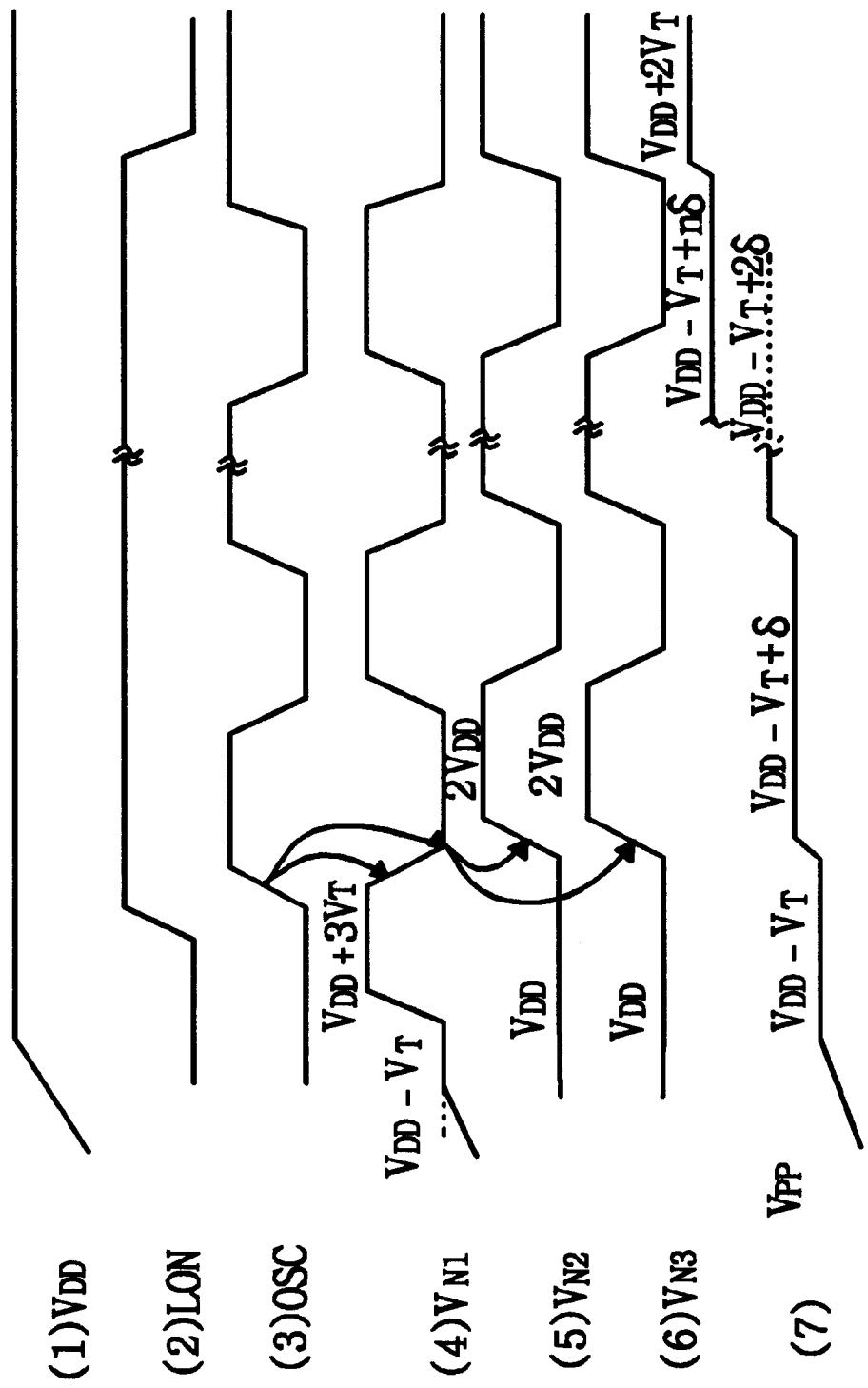
FIG. 4 shows the waveforms of control signals for the charge pump circuit according to the present invention.

FIG. 4 shows the elevated potential VPP in the charge pump circuit, wherein a rise in voltage of δ occurs from the pumping operation by every pulse signal OSC and then the desired level of the elevated potential of (VDD+2VT) is achieved, where δ is the rising voltage during a period of the pulse signal by the pumping operation.

FIG. 3 shows the activated time of the control signals LON1 to LONn which are different from one another.

Each of the control signals LON1 to LONn differs from the activated time of high level, i.e., the control signal LON1 has the longest activated time and another control signal LONn has the shortest activated time.

Hence, the desired elevated potential reaches the level of (VDD+2VT) in short time since the charge pump circuit is driven by the control signal of which activated time is long and thus a large quantity of electric charge is able to be transferred in such a short time.

On the other hand, a precise level of (VDD+2VT) is achieved for the elevated potential VPP due to the small quantity of electric charge since the charge pump circuit is driven by the control signal of which activated time is short and thus a small quantity of electric charge is transferred.

Consequently, if the difference between the maximum level of the desired elevated potential and the present output elevated potential is large, the present invention operates a plurality of the charge pump modules selectively to approach the desired level of the elevated potential quickly by means of supplying a large quantity of electric charge in a short time from activating the pumping enable signal having a relatively long activated time.

And then, the precise level of the elevated potential is achieved by means of supplying a small quantity of electric charge from activating the pumping enable signal having a relatively short activated time.

It will be apparent to those skilled in the art that various modifications and variations can be made in a charge pump circuit of the present invention without departing from the spirit or scope of the inventions. Thus, it is intended that the present invention cover the modifications and variations of this invention provided they come within the scope of the appended claims and their equivalents.

What is claimed is:

1. A charge pump circuit for memory device comprising:
    an elevated potential terminal connected to an output capacitor;
    a level monitor connected to said elevated potential terminal wherein a certain range of voltage is divided into a plurality of voltage level intervals, said level monitor generating a plurality of pumping enable signals corresponding to said plurality of voltage level intervals, said plurality of said pumping enable signals having different activated time with respect to one another,
    said level monitor activating respective pumping enable signals corresponding to said plurality of voltage level intervals to which an elevated potential belongs based on detection of the elevated potential;
    a pulse generator, coupled to said level monitor, for generating a pulse signal when at least one of said plurality of pumping enable signals is activated; and
    a plurality of charge pump modules, coupled to said pulse generator and enabled by said plurality of pumping enable signals, for supplying said output capacitor with electric charge via pumping operation based on said pulse signal.

2. The charge pump circuit according to claim 1, wherein said plurality of voltage level intervals corresponding to each of said plurality of pumping enable signals are divided equally over the certain range of voltage.

3. The charge pump circuit according to claim 1, wherein the closer said voltage level intervals approach the maximum level of said range of voltage, the bigger the difference of voltage levels between said intervals neighboring each other becomes, and wherein the closer said voltage level intervals approach the minimum level of said range of voltage, the smaller the difference of voltage levels between said intervals neighboring each other becomes.

4. The charge pump circuit according to claim 1, wherein activated times of said plurality of pumping enable signals from said level monitor become longer as the elevated potential approaches nearer a maximum level of said range of voltage, and wherein activated times of said plurality of pumping enable signals from said level monitor become shorter as the elevated potential approaches nearer a minimum level of said range of voltage.

5. A method of charge pumping comprising the steps of:
    a) dividing a range of voltage into a plurality of voltage level intervals;
    b) assigning respective pumping signals to the plurality of voltage level intervals, the pumping signals having different respective activated times;
    c) determining a potential of a charge pumping output terminal coupled to an output capacitor;
    d) activating a pumping signal of the voltage intervals based on the determined potential;
    e) generating a pulse signal when at least one of the pumping signals is activated; and
    f) enabling one of a plurality of charge pump modules for supplying pumping charge to the output capacitor, based on the activated pumping signal and the generated pulse signal.

6. The method of charge pumping of claim 5, wherein the charge pumping output terminal is coupled to a device including NMOS transistors,
    said step a) comprising designating an upper limit of the voltage range as (VDD+2Vt), wherein VDD is a power supply voltage of the device and Vt is a threshold voltage of the NMOS transistors.

7. The method of charge pumping of claim 6, wherein the device is a memory device.

8. The method of charge pumping of claim 7, wherein the memory device is a DRAM.

9. The method of charge pumping of claim 6, wherein said step a) further comprises designating a lower limit of the voltage range as (VDD+Vt).

10. The method of charge pumping of claim 5, wherein said step a) comprises dividing the plurality of voltage level intervals equally over the range of voltage.

11. A charge pumping apparatus comprising:
    a charge pumping output terminal coupled to an output capacitor;
    a level monitor for dividing a range of voltage into a plurality of voltage level intervals, assigning respective pumping signals to the plurality of voltage level intervals, determining a potential of the charge pumping output terminal and activating a pumping signal of the voltage level intervals based on the determined potential,
    the pumping signals having different respective activated times;
    a pulse signal generator for generating a pulse signal when at least one of the pumping signals is activated; and
    a plurality of charge pump modules for supplying pumping charge to the output capacitor, at least one of said plurality of charge pump modules being enabled based on the activated pumping signal and the generated pulse signal.

12. The charge pumping apparatus of claim 11, wherein the charge pumping output terminal is coupled to a device including NMOS transistors,
    said level monitor designating an upper limit of the voltage range as (VDD+2Vt), wherein VDD is a power supply voltage of the device and Vt is a threshold voltage of the NMOS transistors.

13. The charge pumping apparatus of claim 12, wherein the device is a memory device.

14. The charge pumping apparatus of claim 13, wherein the device is a DRAM.

15. The charge pumping apparatus of claim 12, wherein said level monitor further designates a lower limit of the voltage range as (VDD+Vt).

16. The charge pumping apparatus of claim 11, wherein said level monitor divides the plurality of voltage level intervals equally over the range of voltage.

* * * * *